United States Patent
Yoneyama et al.

(10) Patent No.: US 6,449,154 B1
(45) Date of Patent: Sep. 10, 2002

(54) HEAT SINK ASSEMBLY RETAINER DEVICE

(75) Inventors: Atsushi Yoneyama, Nagano (JP); Hung-Chi Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/835,932

(22) Filed: Apr. 10, 2001

(30) Foreign Application Priority Data

Dec. 30, 2000 (TW) ...................................... 89222909 U

(51) Int. Cl.[7] ................................................. H05K 7/20
(52) U.S. Cl. ....................... 361/704; 361/687; 361/707; 361/710; 257/717; 257/719; 165/80.3; 174/16.3
(58) Field of Search .................................. 361/687, 689, 361/690, 704–712, 717–719, 724–727, 756; 257/706–727; 165/80.2, 80.3, 80.4, 185, 121–122; 174/16.3; 411/511, 516, 530; 24/981, 482, 485, 539, 531, 545–547, 555, 568, 625; 248/316.7, 505, 506, 510; 439/73, 485, 487

(56) References Cited

U.S. PATENT DOCUMENTS

| | | | | |
|---|---|---|---|---|
| 5,323,848 A | * | 6/1994 | Kin-shon | 165/80.3 |
| 5,477,916 A | * | 12/1995 | Lin | 165/80.3 |
| 5,493,475 A | * | 2/1996 | Lin | 361/710 |
| 5,579,205 A | * | 11/1996 | Tustanivskyi et al. | 361/704 |
| 5,590,025 A | * | 12/1996 | Clemens | 361/695 |
| 5,808,236 A | * | 9/1998 | Brezina et al. | 174/16.3 |

* cited by examiner

*Primary Examiner*—Darren Schuberg
*Assistant Examiner*—Michael Datskovsky
(74) *Attorney, Agent, or Firm*—Wei Te Chung

(57) ABSTRACT

A retainer device for fixing a heat sink (2) on a chip (4) includes a mounting frame (31), a base plate (33) and a mounting lever (32). The heat sink has a number of upwardly extending cooling fins (21) and a pair of securing outwardly extending flanges (23). The mounting frame includes a pair of retaining plates (312) for pressing against the securing flanges and a pair of spring plates (311) connecting the retaining plates. The retaining plate defines a clip (318) for engaging with the heat sink and a latch 317 on each end thereof. The base plate defines four receiving projections (331), each of which defines a notch (332) for receiving the latch. The mouning lever defines a base pole (321) received between the cooling fins. The base pole defines at least one protrusion (323) for pressing against the spring plates and the securing flanges.

17 Claims, 5 Drawing Sheets

HEAT SINK ASSEMBLY RETAINER DEVICE

BACKGROUND OF THE INVENTION

1. Field of the Invention

The present invention relates to a heat sink assembly, and particularly to a heat sink assembly retainer device for fixing a heat sink on a chip unit mounted on a printed circuit board

2. Description of Related Art

Heat produced by an electric chip unit during operation needs to be timely dissipated to ensure proper operation of the chip unit. To achieve this, a heat sink assembly is generally used. U.S. Pat. No. 5,671,118 discloses a socket forming two opposite claws, a chip unit mounted on the socket, a heat sink posited on the chip unit, and a two piece clip having two end positions respectively engaging with the claws and a spring section pressing the heat sink against the chip unit. The clip ensures good thermal connection between the chip unit and the heat sink, promoting conduction of the heat generated by the chip unit away via the heat sink.

However, the connection between the prior art clip and the socket is not secure, thus, when subjected to vibration or shock, the clip may separate from the socket, which will cause the heat sink to lose intimate engagement with the chip unit, decreasing dissipation rate of the heat generated by the chip unit.

Hence, an improved heat sink assembly retainer device is required to overcome the disadvantages of the conventional heat sink assembly retainer.

SUMMARY OF THE INVENTION

Accordingly, an object of the present invention is to provide a heat sink assembly retainer device securely fixing a heat sink on a chip so that an intimate engagement between the chip and the heat sink can always be ensured even when the heat sink assembly is subjected to vibration a shook.

In order to achieve the object set forth, a heat sink assembly retainer device for fixing a heat sink on an electronic integrated chip is provided. The heat sink includes a horizontal base and a plurality of cooling fins. The base defines a receiving channel between the cooling fins. A pair of securing flanges extends outwardly beside the cooling fins. The retainer device includes a mounting frame, a base plate and a mounting lever. The mounting frame includes a pair of opposite retaining plates and a pair of spring plates connecting the retaining plates. The retaining plates and the spring plates define a receiving space for receiving the heat sink. Each of the retaining plates defines a clip in the middle thereof for engaging with a lower edge of the heat sink, and a pair of latches on lateral ends thereof. The base plate forms four receiving projections extending upwardly which define notches for receiving the latches thereby mounting the mounting frame on the base plate. The mounting lever has a base pole received in the receiving channel. The base pole defines protrusions on opposite sides for pressing against the spring plates and the securing flanges.

Other objects, advantages and novel features of the invention will become more apparent from the following detailed description when taken in conjunction with the accompanying drawings.

DETAILED DESCRIPTION OF THE INVENTION

Figure 1:
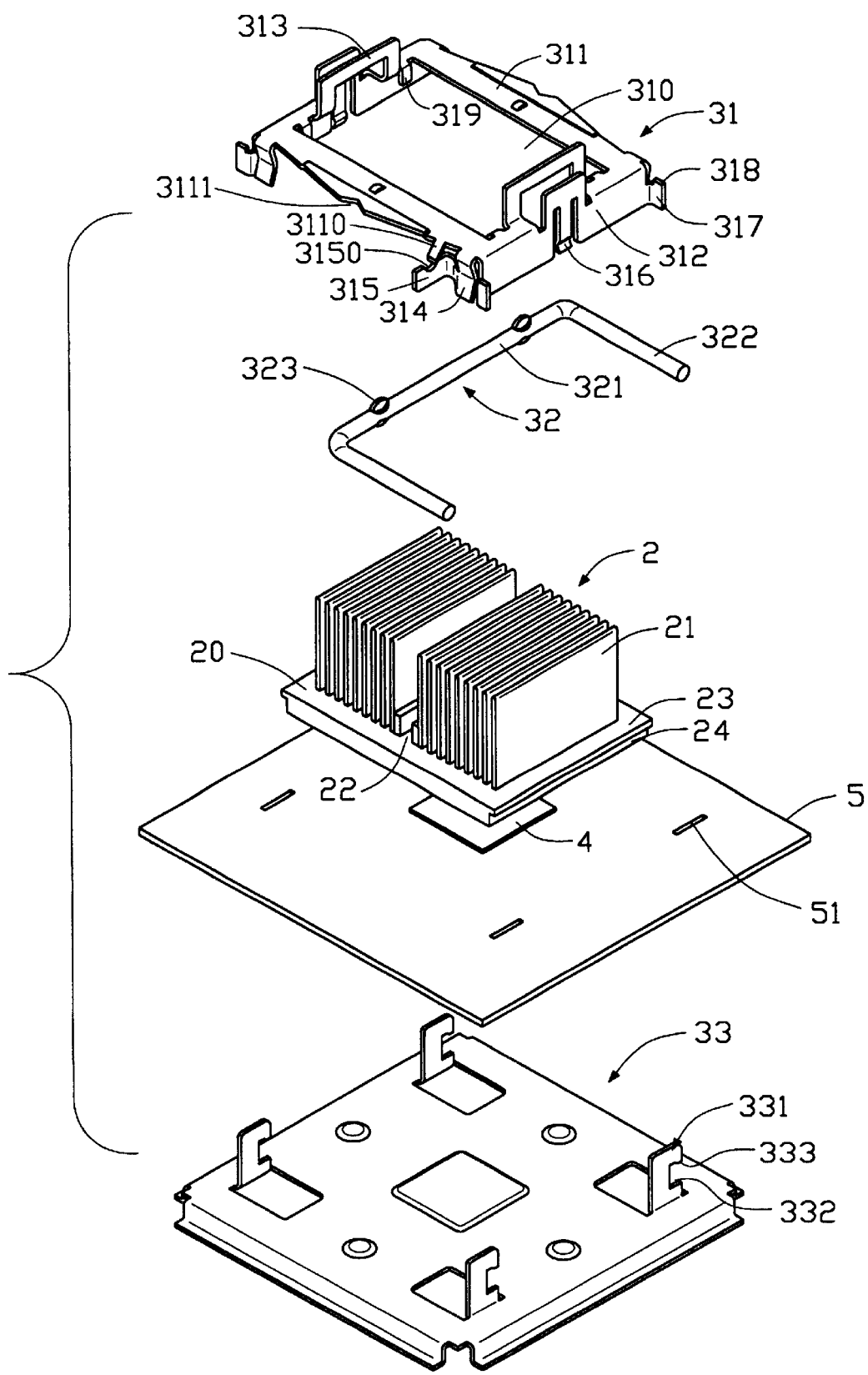
FIG. 1 is an exploded perspective view of a heat sink assembly retainer device in accordance with the present invention, together with a heat sink, a chip and a printed circuit board.

Reference will now be made to the drawing figures to describe the present invention in detail.

Referring to FIG. 1, a heat sink assembly retainer device for fixing a heat sink 2 on an electronic integrated circuit chip 4 includes a mounting frame 31, a mounting lever 32 and a base plate 33.

The heat sink 2 includes a thermally conductive base 20 and a plurality of thermally conductive cooling fins 21 upwardly extending from the base 20. A receiving channel 22 is defined between the cooling fins 21 in the middle of the base 20. At least a pair of securing flanges 23 outwardly extends at the sides of the base 20 beside the cooling fins 21. The base 20 further defines a pair of opposite channels 24 on lateral ends of a bottom face thereof.

The mounting frame 31 includes a pair of opposite retaining plates 312 and a pair of spring plates 311 connecting the retaining plates 312. The retaining plates 312 and the spring plates 311 define a receiving space 310 for receiving the heat sink 2. Each of the spring plates 311 defines a bent arm 314 extending downwardly and rearwardly from an edge thereof. A rim 315 extends outwardly from a free end of the bent arm 314. The rim 315 defines a receiving groove 3150. The spring plate 311 further defines a protrusion 3110 extending outwardly from a portion just above the rim 315 of an edge thereof and a V-shaped retaining cavity 3112 at the middle thereof. The retaining plates 312 each comprise a clip 316 in the middle thereof for engaging with a lower edge of the heat sink 2, a spring beam 313 extending upwardly from an inner edge at the middle of an upper surface thereof and at least two retaining bulges 319 extending downwardly from the inner edge thereof. A pair of latches 317 extends perpendicularly and outwardly from each lateral end of the retaining plate 312. The latch 317 forms a protrusion 318 extending outwardly from a free end thereof.

The mounting lever 32 includes a horizontal base pole 321 and a pair of parallel handles 322 extending perpendicularly to a same direction from lateral ends of the base pole 321. The base pole 321 forms a plurality of protrusions 323 which is perpendicular to both the base pole 321 and the handle 322.

The base plate 33 includes four receiving projections 331 extending upwardly from an upper face thereof. The receiving projections 331 each define a notch 332 for receiving a corresponding latch 317 of the mounting frame 31. The projection 331 comprises a protrusion 323 extending downwardly from an outer edge thereof into the notch 332.

Figure 2:
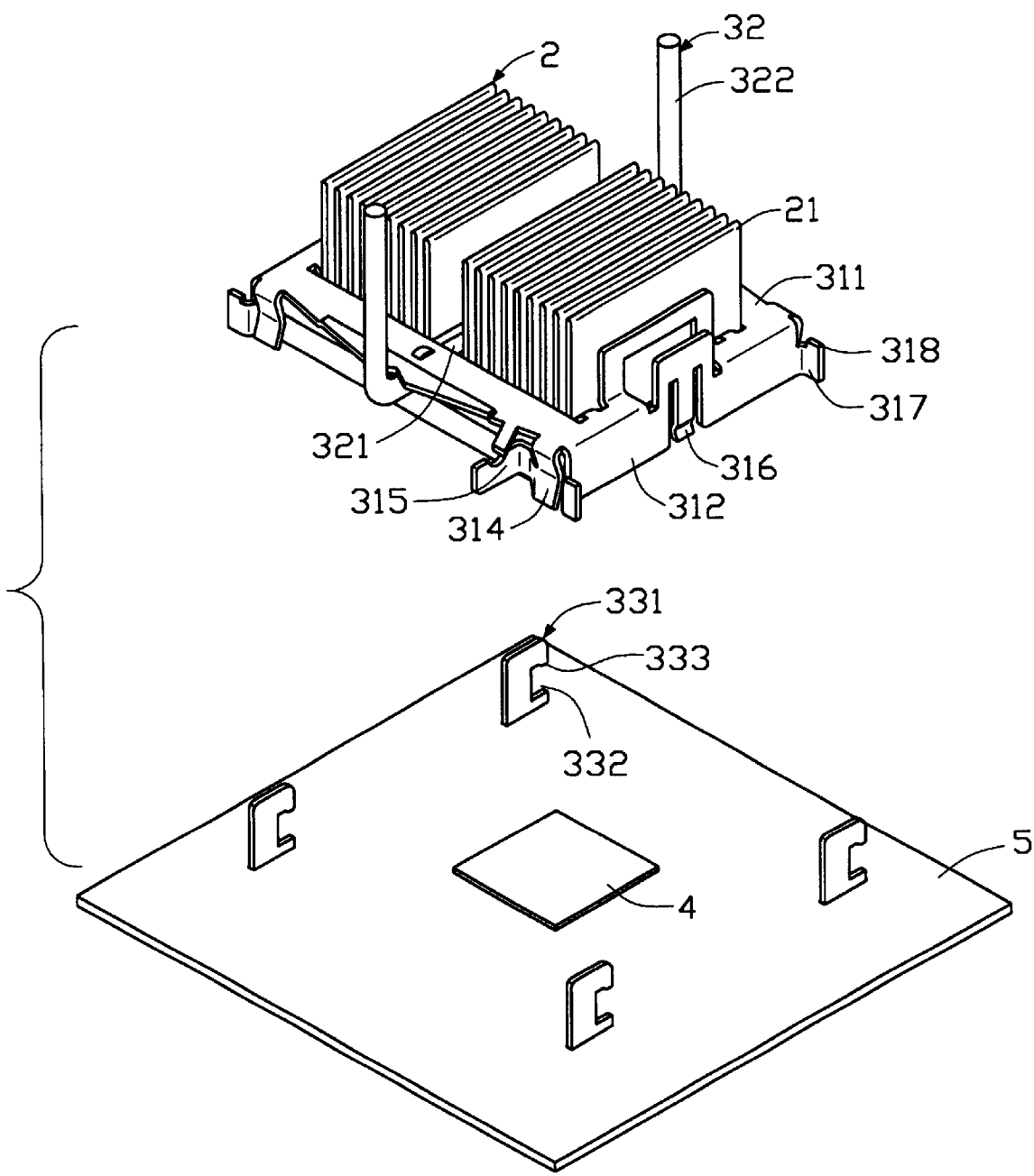
FIG. 2 is a perspective view of the heat sink assembly retainer device of FIG. 1 with the heat sink being assembled on a mounting frame and with a base plate being engaged to the printed circuit board.
Figure 3:
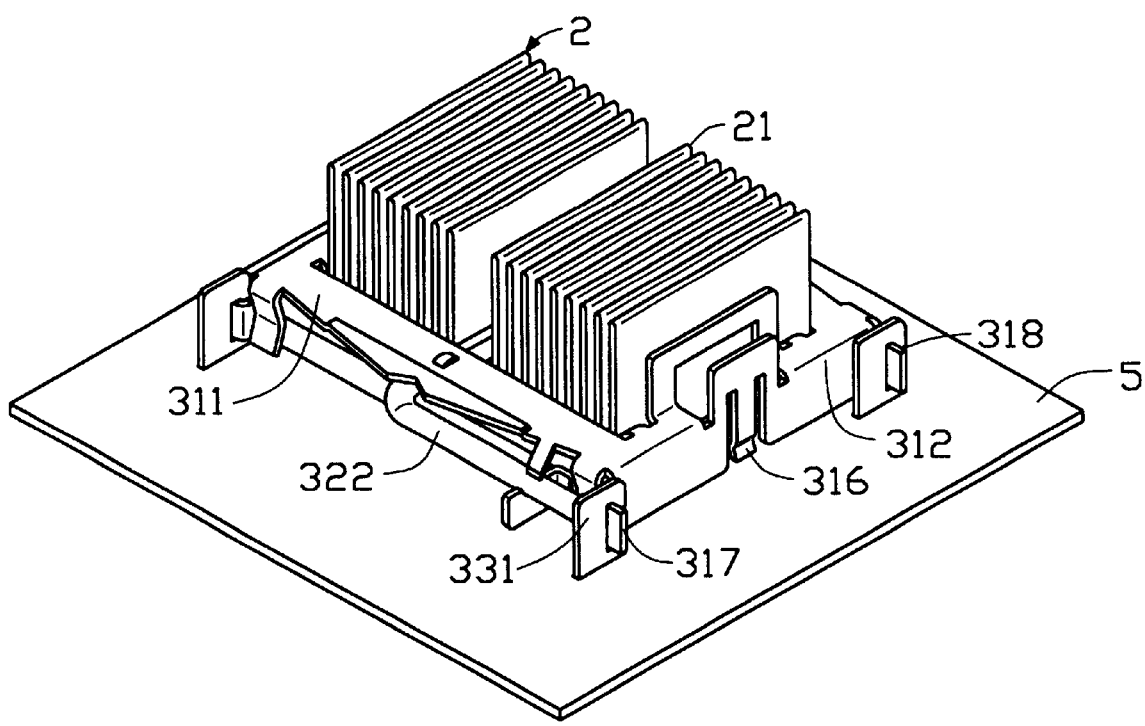
FIG. 3 is a perspective view of the heat sink assembly retainer device of FIG. 1 showing the mounting frame engaged with the base plate.

In assembly, referring to FIG. 2 and FIG. 3, after the chip 4 is mounted on a mating printed circuit board 5, the base plate 23 is mounted to a bottom of the printed circuit board 5 with the receiving projections 331 extending beyond the printed circuit board 5 through slots 51 defined by the printed circuit board 5. The mounting lever 32 is placed on the heat sink 2 with the base pole 321 received in the receiving channel 22 of the heat sink 2 and the handle 322 extending vertically in the retaining cavity 3112. Then the mounting frame 31 is placed on the heat sink 2 with the cooling fins 21 received in the receiving space 310 and the clips 316 engaging with grooves 24 for retaining the mounting frame 3 to the heat sink 2, thereby obtaining a firm connection between the heat sink 2 and the mounting frame 31. The spring beams 313 press against the cooling fins 21 for securely mounting the heat sink 2 in the receiving space 310. Finally, the assembled heat sink 2, mounting frame 31 and the mounting lever 32 are assembled to the base plate 33 by being moved horizontally with the latches 317 received in corresponding receiving notches 332, thereby securing the mounting frame 31 to the base plate 33.

Figure 4:
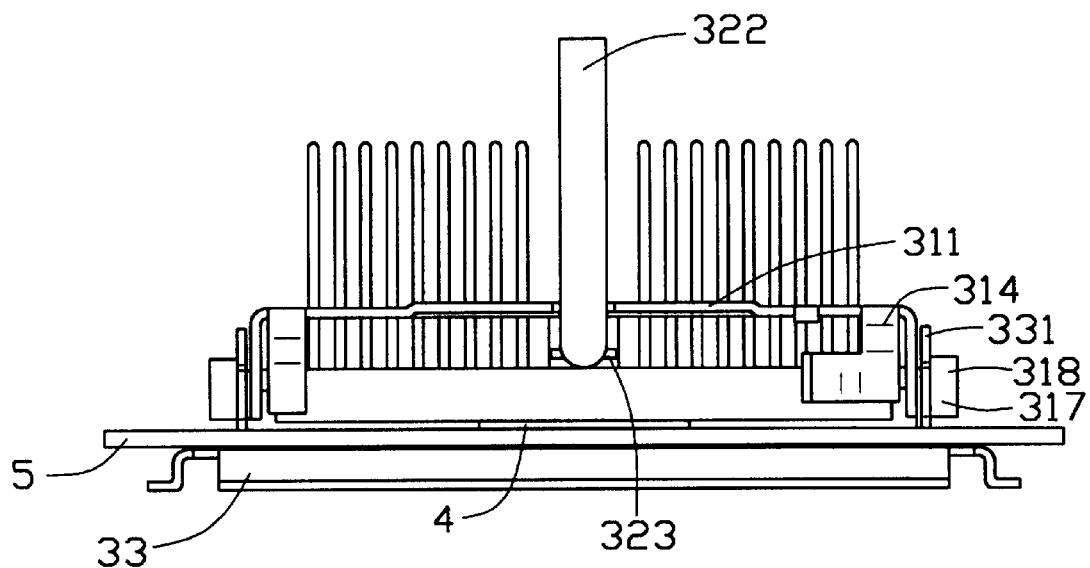
FIG. 4 is front view of the heat sink assembly retainer device of FIG. 1 wherein a handle is shown in a vertical orientation.
Figure 5:
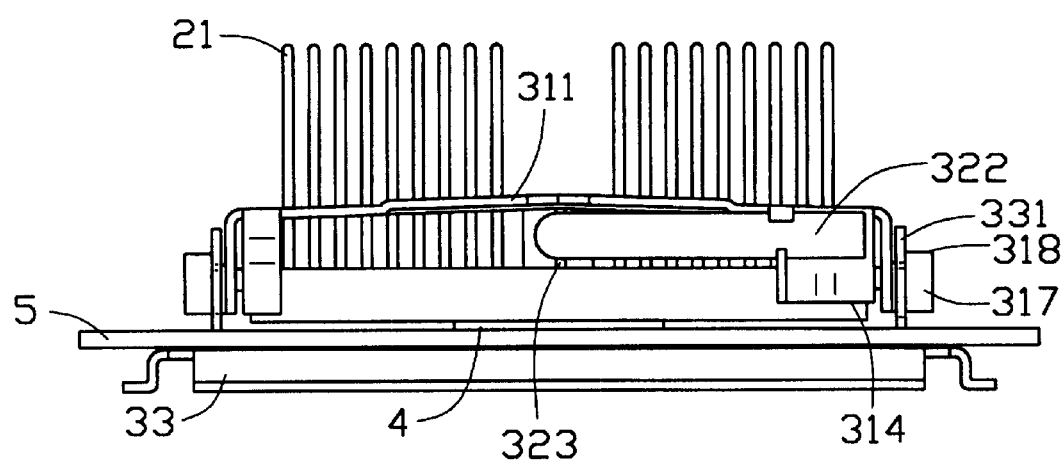
FIG. 5 is a front view of the heat sink assembly retainer device of FIG. 1 wherein the handle is shown in a horizontal orientation.
Figure 6:
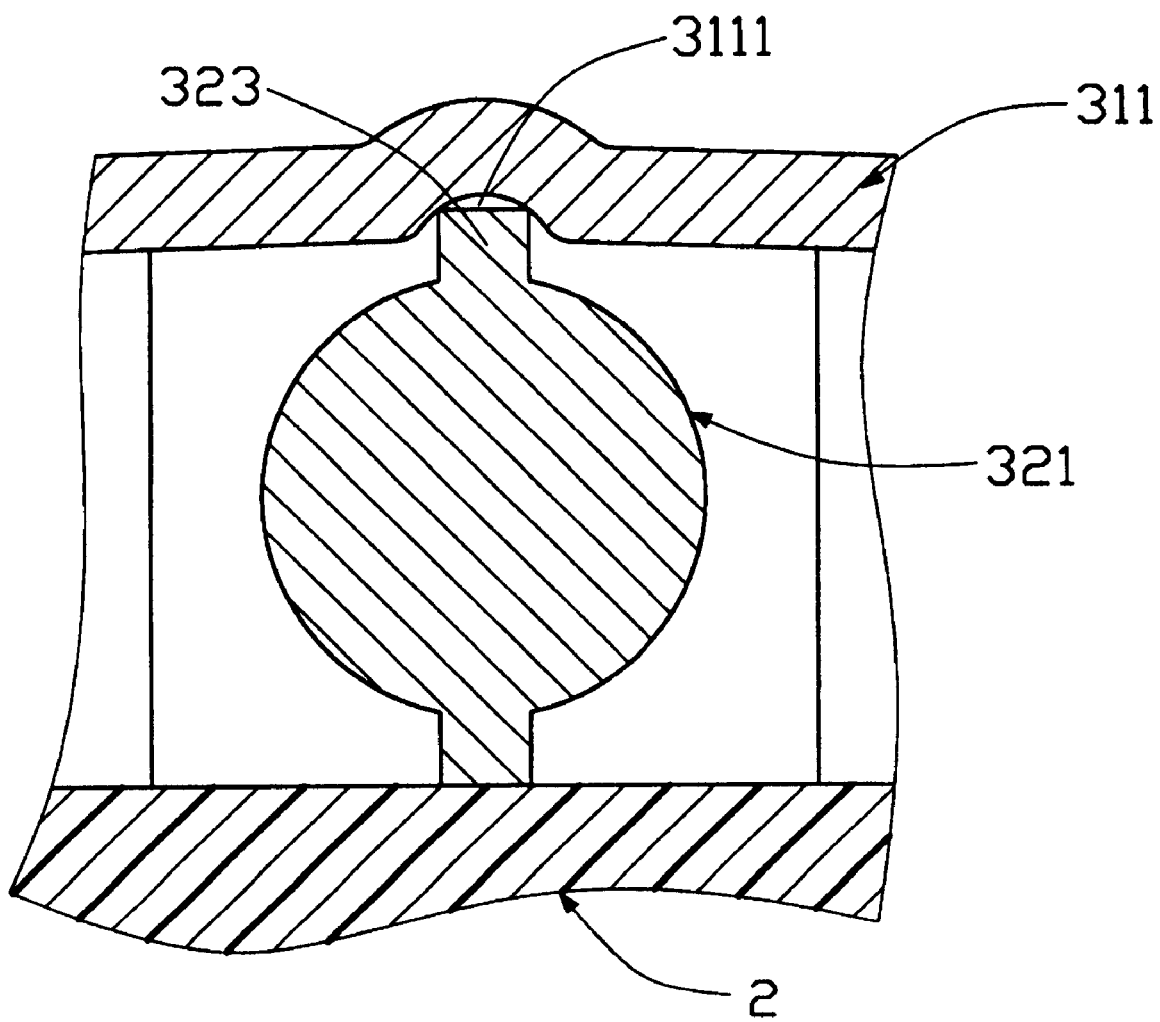
FIG. 6 is an enlarged partial cross-sectional view showing how the base pole engages both the heat sink and the spring plate.

Referring to FIG. 4, FIG. 5 and FIG. 6, while the handle 322 is vertical, the protrusions 323 of the mounting leer 32 are parallel to the mounting flanges 23 and the spring plate 311. The latches 317 are in a lower position of the notch 332. Then, the handles 322 are pivoted to a horizontal position with the handles 322 being received in grooves 3150. The rims 315 are just below the handles 322 for preventing them from moving downwardly and the protrusions 3110 are just above the handles 322 for preventing them from moving upwardly. The protrusions 323 of the mounting lever 321 press against the securing flanges 23 and spring plate 311 and are received in retaining cavities 3111 defined on the spring plate 311 of the mounting frame 31 to properly position the handles 322. Therefore, the protrusions 323 make the spring plates 311 rise, whereby the latches 317 of the retaining plate 31 are located on an upper position of the notch 332. The protrusions 318 of the latches 317 engage with upper edges of the notches 332 and the protrusions 333 of the receiving projections 331 engaging with upper edges of the latches 317, sothe heat sink 2 cannot move transversely and longitudinally. Therefore, the heat sink 2 is securely mounted on the chip 4 thereby increasing the heat dissipating capacity of the heat sink assembly.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, the base plate may be omitted and the latches of the mounting frame may form downward resilient hooks, rather than the upward protrusion, to engage the undersurface of the printed circuit board. Yet for example, the base pole of the mounting lever may be pivotally attached to the mounting frame rather than be somewhat freely sandwiched between the heat sink and the mounting frame as shown in the present embodiment.

What is claimed is:

1. A retainer device adapted for retaining a heat sink to an integrated circuit chip placed on a printed circuit board, comprising
   a base plate adapted to be disposed on one side of a printed circuit board opposite to an integrated circuit chip placed on the other side of the printed circuit board, the base plate partially extending through the printed circuit board;
   a mounting frame including a pair of retaining plates adapted to carry a heat sink, and a pair of spring plates interconnected between the retaining plates, the retaining plates being horizontally moveable relative to the printed circuit board to engage with the base plate to thereby limiting an upward movement thereof relative to the base plate; and
   a mounting lever operable to press the heat sink in a direction toward the base plate against a downward force resulted from contacting with the spring plate of the mounting frame.

2. The retainer device as claimed in claim 1, wherein the base plate has a plurality of receiving projections extending beyond the printed circuit board for engaging with the mounting frame.

3. The retainer device as described in claim 2, wherein the retaining plates have a plurality of latches, and each receiving projection has a notch for receiving a corresponding latch.

4. The retainer device as described in claim 1, wherein the spring plate includes a bent arm extending downwardly and rearwardly from an end thereof, a rim extending downwardly and rearwardly from an end of the bent arm for preventing the handle of the mounting lever from moving upwardly, and a protrusion for preventing the handle of the mounting lever from moving upwardly.

5. The retainer device as described in claim 1, wherein each retaining plate comprises a plurality of retaining bulges for pressing against a mounting flange of the heat sink and a clip for engaging with a lower edge of the heat sink.

6. The retainer device as described in claim 1, wherein the retaining plates each form a clip for engaging with a lower edge of the heat sink.

7. The retainer device as described in claim 1, wherein the retaining plates each form an upwardly extending spring beam.

8. The retainer device as described in claim 1, wherein the mounting lever forms a pair of protrusions for pressing against the heat sink and the spring plates.

9. The retainer device as described in claim 8, wherein the spring plate defines a retaining cavity for receiving the protrusion of the mounting lever.

10. A heat sink assembly adapted for dissipating heat generated during operation of an integrated circuit chip placed on a printed circuit board, comprising:
    a heat sink abutting an upper surface of the chip, the heat sink including a base and a plurality of cooling fins extending upwardly from the base, and a retainer device for retaining the heat sink on the upper face of the chip including a base plate, a mounting frame and a mounting lever, the base plate being disposed on a bottom side of the printed circuit board and including a plurality of receiving projections extending through the printed circuit board for securing the mounting frame, the mounting frame including a pair of retaining plates for retaining the heat sink on the base plate and a pair of spring plates connecting the retaining plates, the retaining plate comprising a pair of retaining members for engaging with the heat sink, the mounting lever including a plurality of protrusions for pressing against the heat sink.

11. The heat sink assembly of claim 10, wherein the retaining member includes a plurality of retaining bulges forpressing against an upper surface of the heat sink and a plurality of clip engaging with a bottom surface of the heat sink.

12. The heat sink assembly of claim 10, wherein the retaining plate each comprises a pair of latches extending outwardly from eachend thereof, each latch having a protrusion extending upwardly from an outer edge thereof, and wherein the receiving projection defines a notch for receiving the latch of the retaining plate and a protrusion extending downwardly from an upper side of the notch for engaging with the protrusion of the latch.

13. A heat sink assembly comprising:

a printed circuit board;

an integrated circuit chip positioned on said printed circuit board;

a retainer device including at least one mounting frame and one mounting lever, said mounting frame horizontally encircling the heat sink with latches thereon, said mounting lever including a base pole lying across the heat sink with protrusions thereon, and a handle extending from said base pole; wherein said base pole is sandwiched between said mounting frame and said heat sink, and urges the mounting frame to be in a tension manner by said protrusions when said mounting lever is in a first position while relieves the mounting from said tension manner when said mounting leveris in a second position.

14. The assembly of claim 13, wherein in the first position said base pole respectively exerts upward and downward forces against the mounting frame and the heat sink.

15. The assembly of claim 13, wherein said retainer device further includes a base plate positioned on an underside of said printed circuit board with projections extending upwardly through the printed circuit board to engage the corresponding latches.

16. A heat sink assembly comprising:

a printed circuit board;

an integrated circuit chip positioned on said printed circuit board;

a retainer device including:

a base plate positioned on an underside of said printed circuit board with projections upwardly extending through the printed circuit board;

one mounting frame horizontally encircling the heat sink with thereon latches engaging the corresponding projections; and a mounting lever including protrusions thereon and a handle operatively pivotal relative to the mounting frame; wherein the protrusions exerts an upward force on the mounting frame when said handle is in a first position while relieve the mounting frame from a tension manner when said handle is in a second position.

17. The assembly of claim 16, wherein said mounting lever further includes a horizontal base pole on which the protrusions are formed, and said base pole lies across the heat sink.

* * * * *